United States Patent
Park et al.

(10) Patent No.: US 11,640,877 B2
(45) Date of Patent: May 2, 2023

(54) ELECTRONIC COMPONENT AND BOARD HAVING THE SAME

(71) Applicant: SAMSUNG ELECTRO-MECHANICS CO., LTD., Suwon-si (KR)

(72) Inventors: Heung Kil Park, Suwon-si (KR); Gu Won Ji, Suwon-si (KR); Sang Soo Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/307,411

(22) Filed: May 4, 2021

(65) Prior Publication Data

US 2022/0130613 A1 Apr. 28, 2022

(30) Foreign Application Priority Data

Oct. 28, 2020 (KR) .................. 10-2020-0140955

(51) Int. Cl.
*H01G 4/30* (2006.01)
*H01G 4/248* (2006.01)
*H05K 1/18* (2006.01)
*H01G 4/012* (2006.01)

(52) U.S. Cl.
CPC ............. *H01G 4/30* (2013.01); *H01G 4/012* (2013.01); *H01G 4/248* (2013.01); *H05K 1/181* (2013.01); *H05K 2201/10015* (2013.01)

(58) Field of Classification Search
CPC ....................................... H01G 4/30
USPC ....................................... 174/260
See application file for complete search history.

(56) References Cited

U.S. PATENT DOCUMENTS

| | | | |
|---|---|---|---|
| 10,178,770 B1 * | 1/2019 | Burk | H05K 1/18 |
| 2015/0171618 A1 * | 6/2015 | Sumi | H01C 7/105 |
| | | | 427/126.3 |
| 2015/0340154 A1 * | 11/2015 | Kim | H01G 4/248 |
| | | | 174/260 |
| 2018/0144868 A1 * | 5/2018 | Park | H05K 3/3442 |
| 2019/0180945 A1 | 6/2019 | Kim et al. | |

FOREIGN PATENT DOCUMENTS

| KR | 10-2015-0089277 A | 8/2015 |
|---|---|---|
| KR | 10-2019-0030635 A | 3/2019 |
| KR | 10-2019-0068082 A | 6/2019 |

* cited by examiner

*Primary Examiner* — Stanley Tso
(74) *Attorney, Agent, or Firm* — Morgan, Lewis & Bockius LLP

(57) ABSTRACT

An electronic component includes: a multilayer capacitor including a capacitor body and first and second external electrodes respectively disposed on opposing end surfaces of the capacitor body; and an ESD member disposed on a first side surface of the multilayer capacitor perpendicular to a mounting surface of the multilayer capacitor, such that the ESD of the multilayer capacitor may be effectively controlled.

16 Claims, 6 Drawing Sheets

ELECTRONIC COMPONENT AND BOARD HAVING THE SAME

CROSS-REFERENCE TO RELATED APPLICATION(S)

This application claims the benefit of priority to Korean Patent Application No. 10-2020-0140955, filed on Oct. 28, 2020 in the Korean Intellectual Property Office, the disclosure of which is incorporated herein by reference in its entirety.

TECHNICAL FIELD

The present disclosure relates to an electronic component and a board having the same.

BACKGROUND

In accordance with the spread of electronic devices such as Internet of Things (IoT) devices, promoted by smartphones, a countermeasure against electrostatic discharge (ESD) caused by contact between a human body and an electronic device has become important.

SUMMARY

An aspect of the present disclosure may provide an electronic component whose electrostatic discharge (ESD) may be effectively controlled, and a board having the same.

According to an aspect of the present disclosure, an electronic component may include: a multilayer capacitor including a capacitor body and first and second external electrodes respectively disposed on opposing end surfaces of the capacitor body; and an ESD discharge member disposed on a first side surface of the multilayer capacitor perpendicular to a mounting surface of the multilayer capacitor.

The ESD discharge member may include: a substrate; first and second external terminals disposed on two ends of the substrate, respectively, to be connected to the first and second external electrodes, respectively; first and second emission electrodes disposed on a first surface of the substrate facing the capacitor body, extending from the first and second external terminals, respectively, and disposed to be spaced apart from each other; and an ESD function portion disposed on the first surface of the substrate to cover portions of the first and second emission electrodes.

The ESD discharge member may further include an encapsulation portion disposed on the first surface of the substrate to cover portions of the first and second emission electrodes other than the portions of the first and second emission electrodes covered by the ESD function portion.

One surface of each of the first and second external terminals and a surface of the encapsulation portion may form one substantially flat surface.

One surfaces of the first and second external terminals may be more convex than a surface of the encapsulation portion.

The ESD discharge member may include: a substrate; and first and second external terminals disposed on two ends of the substrate, respectively, to be connected to the first and second external electrodes, respectively.

The ESD discharge member may be provided in plural and include an ESD discharge member for a high voltage disposed on the first side surface of the multilayer capacitor perpendicular to the mounting surface of the multilayer capacitor, and an ESD discharge member for a lower voltage disposed on a second side surface of the multilayer capacitor perpendicular to the mounting surface of the multilayer capacitor to face the ESD discharge member for the high voltage.

The ESD discharge member may be a varistor.

The capacitor body may include first and second surfaces opposing each other, third and fourth surfaces connected to the first and second surfaces and opposing each other, and fifth and sixth surfaces connected to the first and second surfaces, and connected to the third and fourth surfaces, and opposing each other, and one end portions of the first and second internal electrodes may be exposed through the third and fourth surfaces, respectively, and the first and second external electrodes may include, respectively, first and second connection portions disposed on the third and fourth surfaces of the capacitor body, respectively, and first and second band portions extending from the first and second connection portions to portions of the first, second, fifth, and sixth surfaces of the capacitor body, respectively, and connected to the first and second external terminals, respectively.

The substrate may include ceramics or printed circuit board (PCB) materials. The ceramics may be an alumina. Further, The PCB materials may be a frame retardant 4 (FR4).

According to another aspect of the present disclosure, a board having an electronic component may include: a multilayer capacitor including a capacitor body and first and second external electrodes respectively disposed on opposing end surfaces of the capacitor body; an ESD discharge member disposed on a first side surface of the multilayer capacitor perpendicular to amounting surface of the multilayer capacitor and including a substrate and first and second external terminals disposed on two ends of the substrate, respectively, to be connected to the first and second external electrodes, respectively; and an insulating substrate and first and second electrode pads disposed on an upper surface of the insulating substrate to be spaced apart from each other. The first external electrode and the first external terminal are bonded to the first electrode pad by a solder in a state in which they are connected to each other, and the second external electrode and the second external terminal are bonded to the second electrode pad by a solder in a state in which they are connected to each other.

According to still another aspect of the present disclosure, an electronic component may include: a multilayer capacitor including a capacitor body and first and second external electrodes respectively disposed on opposing end surfaces of the capacitor body in a first direction, wherein the capacitor body comprises a plurality of dielectric layers and first and second internal electrodes alternately disposed in a second direction with each of the dielectric layers interposed therebetween; and an electrostatic discharge (ESD) member disposed on a first side surface of the multilayer capacitor perpendicular to the end surfaces of the capacitor body and parallel to the second direction.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
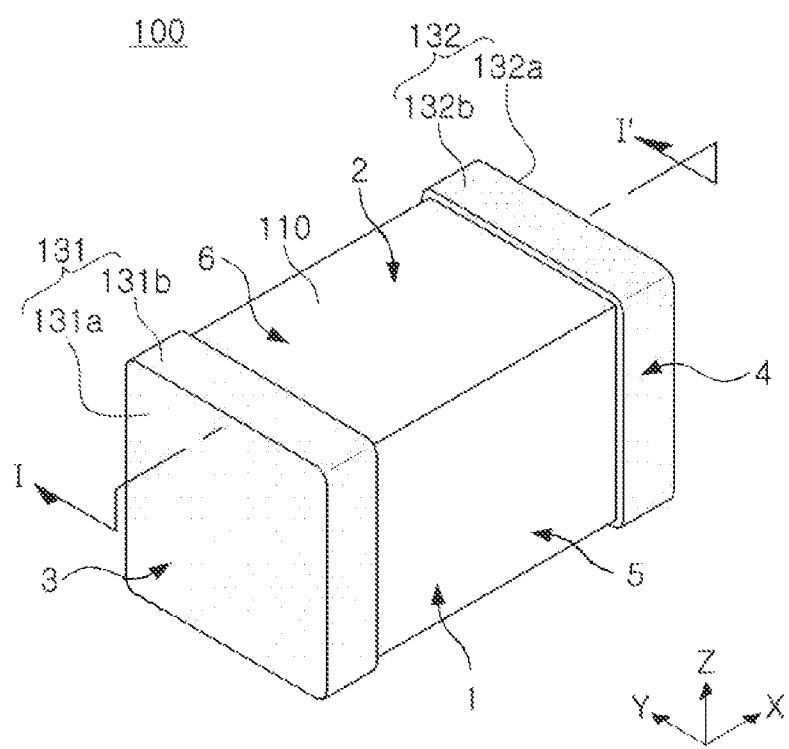
FIG. 1 is a schematic perspective view illustrating a multilayer capacitor applied to the present disclosure.

Hereinafter, exemplary embodiments of the present disclosure will now be described in detail with reference to the accompanying drawings.

Directions will be defined in order to clearly describe exemplary embodiments in the present disclosure. X, Y and Z in the drawings refer to a length direction, a width direction, and a thickness direction of a multilayer capacitor and an electronic component, respectively.

Here, the Z direction may be used as being conceptually the same as a stacking direction in which dielectric layers are stacked in the present exemplary embodiment.

Figure 2A:
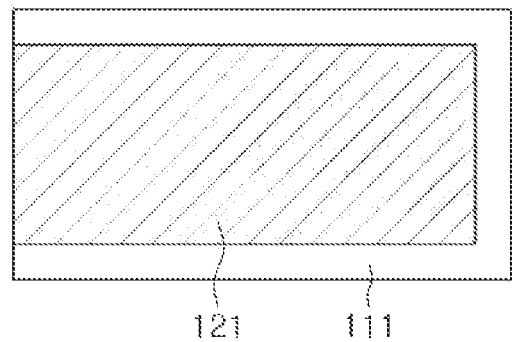
FIGS. 2A and 2B are perspective views illustrating, respectively, first and second internal electrodes of FIG. 1.
Figure 2B:
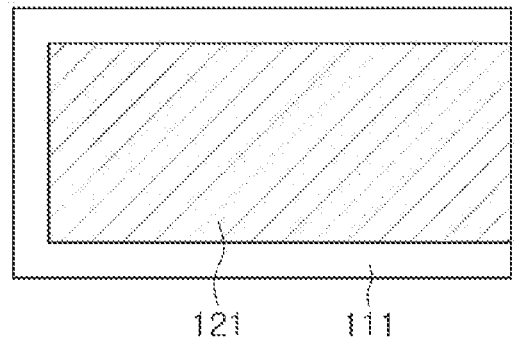
Figure 3:
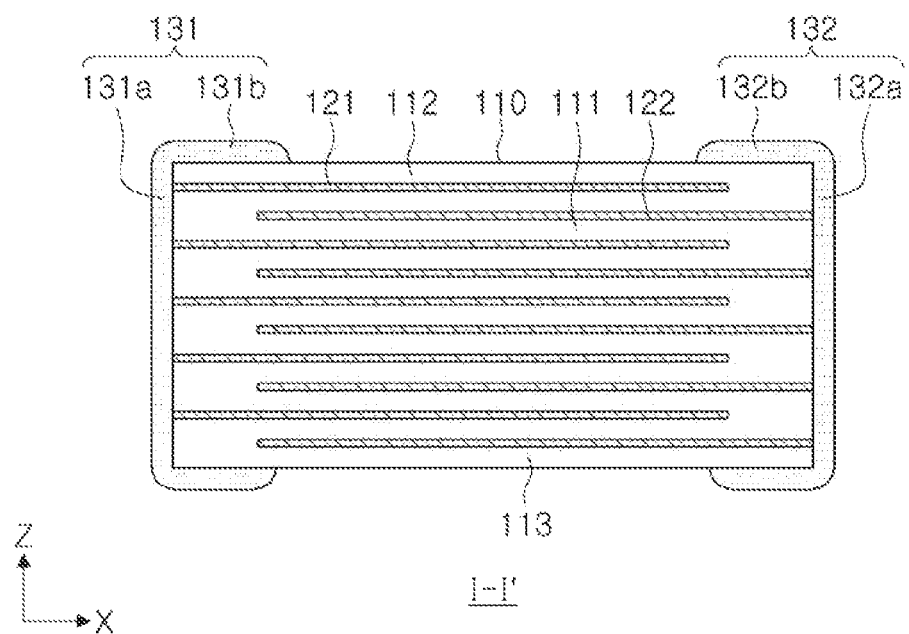
FIG. 3 is a cross-sectional view taken along line I-I' of FIG. 1.

FIG. 1 is a schematic perspective view illustrating a multilayer capacitor applied to the present disclosure, FIGS. 2A and 2B are perspective views illustrating, respectively, first and second internal electrodes of FIG. 1, and FIG. 3 is a cross-sectional view taken along line I-I' of FIG. 1.

A structure of a multilayer capacitor 100 used in an electronic component according to the present exemplary embodiment will be described with reference to FIGS. 1 through 3.

The multilayer capacitor 100 according to the present exemplary embodiment may include a capacitor body 110 and first and second external electrodes 131 and 132 on opposing end surfaces of the capacitor body 110 in the X direction, respectively.

The capacitor body 110 may be formed by stacking a plurality of dielectric layers 111 in the Z direction and then sintering the plurality of dielectric layers 111.

Adjacent dielectric layers 111 of the capacitor body 110 may be integrated with each other so that boundaries therebetween are not readily apparent without using a scanning electron microscope (SEM).

In addition, the capacitor body 110 may include a plurality of dielectric layers 111 and first and second internal electrodes 121 and 122 alternately disposed in the Z direction with each of the dielectric layers 111 interposed therebetween. In this case, the first and second internal electrodes 121 and 122 may have different polarities.

In addition, the capacitor body 110 may include an active region and cover regions 112 and 113.

The active region may contribute to forming a capacitance of the multilayer capacitor.

In addition, the cover regions 112 and 113 may be provided as margin portions on upper and lower surfaces of the active region in the Z direction, respectively.

The cover regions 112 and 113 may be formed by stacking a single dielectric layer or two or more dielectric layers on the upper and lower surfaces of the active region, respectively.

In addition, the cover regions 112 and 113 may basically serve to prevent the first and second internal electrodes 121 and 122 from being damaged due to physical or chemical stress.

A shape of the capacitor body 110 is not particularly limited, but may be substantially a hexahedral shape.

In the present exemplary embodiment, the capacitor body 110 may include first and second surfaces 1 and 2 opposing each other in the Z direction, third and fourth surfaces 3 and 4 connected to the first and second surfaces 1 and 2 and opposing each other in the X direction, and fifth and sixth surfaces 5 and 6 connected to the first and second surfaces 1 and 2, connected to the third and fourth surfaces 3 and 4, and opposing each other. Here, the first surface 1 may be a mounting surface.

In addition, a shape and a dimension of the capacitor body 110 and the number of stacked dielectric layers 111 are not limited to those illustrated in the drawings of the present exemplary embodiment.

The dielectric layer 111 may include ceramic powders such as $BaTiO_3$-based ceramic powders, or the like.

An example of the $BaTiO_3$-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr or the like, is partially solid-dissolved in $BaTiO_3$. However, the $BaTiO_3$-based ceramic powder according to the present disclosure is not limited thereto.

In addition, the dielectric layer 111 may further include a ceramic additive, an organic solvent, a plasticizer, a binder, a dispersant, and the like.

The ceramic additives may contain a transition metal oxide or a transition metal carbide, rare earth elements, magnesium (Mg), aluminum (Al), or the like.

The first and second internal electrodes 121 and 122 may be electrodes to which different polarities are applied.

The first and second internal electrodes 121 and 122 may be disposed on the dielectric layers 111 and stacked in the Z direction, respectively.

In addition, the first and second internal electrodes 121 and 122 may be alternately disposed in the capacitor body 110 to face each other along the Z direction with each of the dielectric layers 111 interposed therebetween.

In this case, the first and second internal electrodes 121 and 122 may be electrically insulated from each other by each of the dielectric layers 111 disposed therebetween.

Meanwhile, a structure in which the plurality of internal electrodes are stacked in the Z direction has been illustrated and described in the present exemplary embodiment. However, the present disclosure is not limited thereto, and may also be applied to a structure in which the internal electrode are stacked in the Y direction, if necessary.

One end portion of the first internal electrode 121 may be exposed through the third surface 3 of the capacitor body 110.

The one end portion of the first internal electrode 121 exposed through the third surface 3 of the capacitor body 110 as described above may be electrically connected to the first external electrode 131 disposed on one end surface (e.g., the third surface 3) of the capacitor body 110 in the X direction.

One end portion of the second internal electrode 122 may be exposed through the fourth surface 4 of the capacitor body 110.

The one end portion of the second internal electrode 122 exposed through the fourth surface 4 of the capacitor body 110 as described above may be electrically connected to the second external electrode 132 disposed on the other end surface (e.g., the fourth surface 4) of the capacitor body 110 in the X direction.

According to the configuration as described above, when predetermined voltages are applied to the first and second external electrodes 131 and 132, electric charges may be accumulated between the first and second internal electrodes 121 and 122.

In this case, a capacitance of the multilayer capacitor 100 may be in proportion to an area of the first and second internal electrodes 121 and 122 overlapping each other along the Z direction in the active region.

In addition, a material of each of the first and second internal electrodes 121 and 122 is not particularly limited.

In addition, the first and second internal electrodes 121 and 122 may be formed using a conductive paste including one or more of a noble metal material, nickel (Ni), and copper (Cu).

The noble metal material may be platinum (Pt), palladium (Pd), a palladium-silver (Pd—Ag) alloy, and the like.

In addition, a method of printing the conductive paste may be a screen-printing method, a gravure printing method, or the like, but is not limited thereto.

Voltages having different polarities may be provided to the first and second external electrodes 131 and 132, respectively, and the first and second external electrodes 131 and 132 may be disposed on the opposing end surfaces of the capacitor body 110 in the X direction, respectively, and may be electrically connected to the exposed end portions of the first and second internal electrodes 121 and 122, respectively.

The first external electrode 131 may include a first connection portion 131a and a first band portion 131b.

The first connection portion 131a may be disposed on the third surface 3 of the capacitor body 110.

The first connection portion 131a may be in contact with the end portions of the first internal electrodes 121 externally exposed through the third surface 3 of the capacitor body 110 to serve to electrically connect the first internal electrodes 121 and the first external electrode 131 to each other.

The first band portion 131b may extend from the first connection portion 131a to portions of the first, second, fifth, and sixth surfaces 1, 2, 5, and 6 of the capacitor body 110.

The first band portion 131b may serve to improve fixing strength of the first external electrode 131.

The second external electrode 132 may include a second connection portion 132a and a second band portion 132b.

The second connection portion 132a may be disposed on the fourth surface 4 of the capacitor body 110.

The second connection portion 132a may be in contact with the end portions of the second internal electrodes 122 externally exposed through the fourth surface 4 of the capacitor body 110 to serve to electrically connect the second internal electrodes 122 and the second external electrode 132 to each other.

The second band portion 132b may extend from the second connection portion 132a to portions of the first, second, fifth, and sixth surfaces 1, 2, 5, and 6 of the capacitor body 110.

The second band portion 132b may serve to improve fixing strength of the second external electrode 132.

Meanwhile, the first and second external electrodes 131 and 132 may further include plating layers.

The plating layers may include first and second nickel (Ni) plating layers disposed on the capacitor body 110 and first and second tin (Sn) plating layers covering, respectively, the first and second nickel plating layers.

Figure 4:
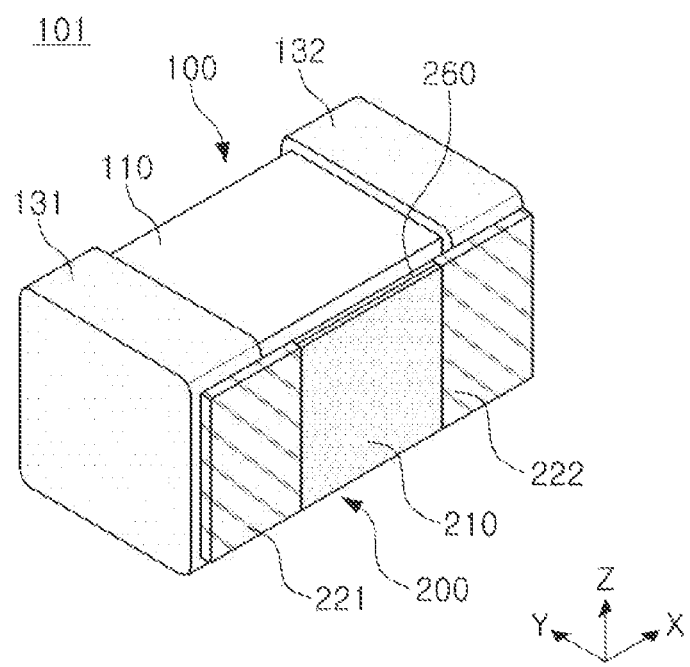
FIG. 4 is a schematic perspective view illustrating an electronic component according to a first exemplary embodiment in the present disclosure.
Figure 5:
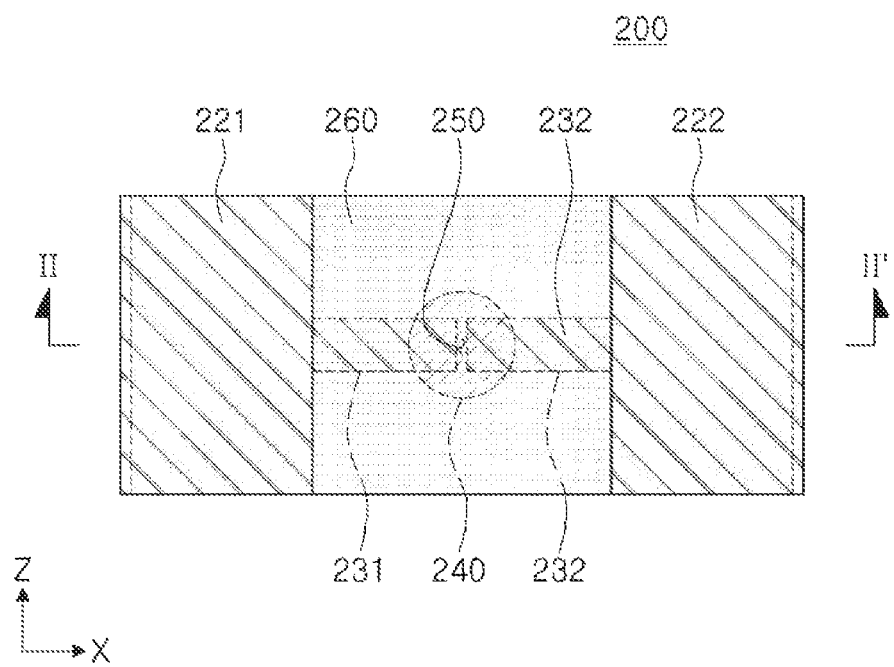
FIG. 5 is a plan perspective view illustrating an electrostatic discharge (ESD) member of FIG. 4 when viewed from one surface in a Y direction.
Figure 6:
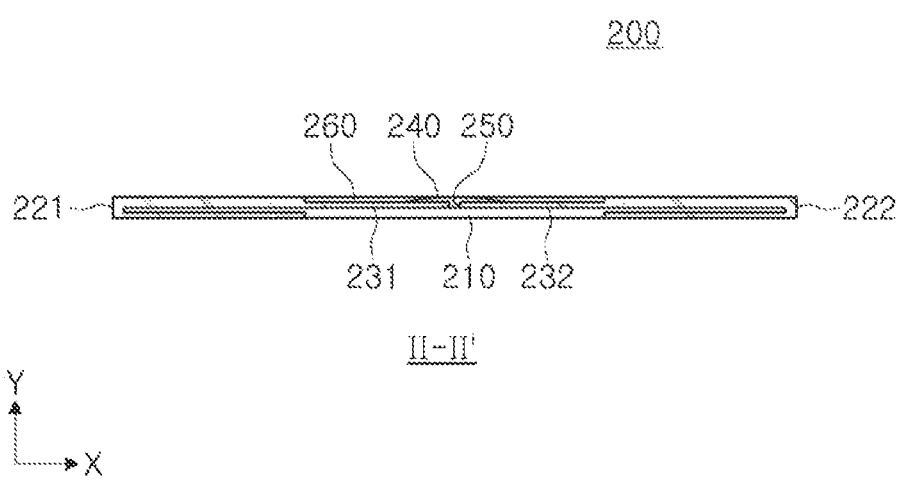
FIG. 6 is a cross-sectional view taken along line II-II' of FIG. 5.

FIG. 4 is a schematic perspective view illustrating an electronic component according to a first exemplary embodiment in the present disclosure, FIG. 5 is a plan perspective view illustrating an electrostatic discharge (ESD) member of FIG. 4 when viewed from one surface in the Y direction, and FIG. 6 is a cross-sectional view taken along line II-II' of FIG. 5.

Referring to FIGS. 4 through 6, the electronic component according to the present exemplary embodiment may include a multilayer capacitor and an ESD member.

Hereinafter, when describing an ESD member, an encapsulation portion and the like according to an exemplary embodiment in the present disclosure, surfaces facing the same directions as directions that six surfaces of the capacitor body face will be defined as the same surfaces, for convenience of explanation.

The ESD member 200 may be disposed on the fifth surface 5 of the capacitor body 110, which is a first side surface of the multilayer capacitor 100 perpendicular to the mounting surface of the multilayer capacitor 100.

Such an ESD member 200 may include a substrate 210, first and second external terminals 221 and 222, first and second emission electrodes 231 and 232, and an ESD function portion 240.

When the ESD member is disposed on the mounting surface of the multilayer capacitor, a current path may become long, such that equivalent series inductance (ESL) of the multilayer capacitor may increase. In addition, a thickness of a chip may increase by a thickness of the ESD member, and it may thus be difficult to apply the electronic component to a set having many restrictions on a mounting height.

In the present exemplary embodiment, by attaching the ESD member to one side surface of the multilayer capacitor perpendicular to the mounting surface of the multilayer capacitor, an effect that an increase in a chip thickness and an increase in ESL do not occur may be expected.

In another exemplary embodiment, the ESD member 200 may be disposed on a first side surface of the multilayer capacitor 100 perpendicular to the end surfaces of the capacitor body (e.g., the third and fourth surfaces 3 and 4) and parallel to the stacking direction (e.g., Z direction) of the first and second internal electrodes 121 and 122.

The substrate 210 may include a high rigidity material such as ceramics or printed circuit board (PCB) material, but is not limited thereto. The ceramics may be an alumina (Al2O3). Further, The PCB materials may be a frame retardant 4 (FR4).

The first and second external terminals 221 and 222 may be disposed on both ends of the substrate 210 in the X direction, respectively, to be connected to the first and second band portions 131b and 132b of the first and second external electrodes 131 and 132, respectively.

The first and second external terminals 221 and 222 may include nickel (Ni), copper (Cu), tin (Sn), or alloys thereof, and are not limited thereto.

In addition, the first and second external terminals 221 and 222 may be formed by dipping, but may also be formed by another method such as plating.

In this case, the first and second external terminals 221 and 222 and the first and second band portions 131b and 132b may be bonded to each other using a conductive adhesive, a conductive resin or the like.

Meanwhile, although not illustrated in the drawings, nickel/tin (Ni/Sn) plating layers by plating may be further disposed on the outer surfaces of the first and second external terminals 221 and 222.

The first and second emission electrodes 231 and 232 may be disposed on a first surface of the substrate 210 facing the capacitor body 110 in the Y direction, may extend from the first and second external terminals 221 and 222, respectively, and may be disposed to be spaced apart from each other.

Therefore, a space portion 250 may be provided between end portions of the first and second emission electrodes 231 and 232 on the first surface of the substrate 210. Such a space portion 250 may serve to bypass ESD.

A gap between the first and second emission electrodes 231 and 232 in the space portion 250 may serve to determine an ESD turn-on voltage, and may be preferably 1 to 20 µm. Here, the ESD turn-on voltage refers to a voltage through which high-voltage static electricity is conducted to a lead electrode due to an operation of the ESD.

The first and second emission electrodes 231 and 232 may be formed by printing a conductive paste on the substrate 210.

In addition, the first and second emission electrodes 231 and 232 may be formed to have a step with respect to end portions of the first and second external terminals 221 and 222 in the X direction. For example, a thickness, in the Z direction, of the first and second emission electrodes 231 and 232 may be smaller than a thickness, in the Z direction, of the first and second external terminals 221 and 222 disposed on the first surface of the substrate 210.

Even though the ESD function portion 240 and an encapsulation portion 260 are formed, such a step may prevent the encapsulation portion 260 from becoming more convex than surfaces of the first and second external terminals 221 and 222.

The ESD function portion 240 may be disposed at the space portion 250 on the first surface of the substrate 210 in the Y direction, and may cover portions of the first and second emission electrodes 231 and 232.

Such an ESD function portion 240 may be formed by printing an ESD paste on the substrate 210.

A conductive metal included in the ESD paste may include at least one or more of copper (Cu), silver (Ag), palladium (Pd), tin (Sn), nickel (Ni), and gold (Au) or may be a compound thereof, but is not limited thereto.

As another example, the ESD function portion 240 may include a conductive polymer, but is not necessarily limited thereto.

The conductive polymer may have characteristics of a non-conductor when a signal voltage input from a signal interface through which a signal is transferred from a connector to a system or an integrated circuit (IC), an IC block of a power supply terminal, or a communications line corresponds to a rated voltage (circuit voltage) level, but may have characteristics of a conductor when an overvoltage such as ESD or the like, is instantaneously generated.

The encapsulation portion 260 may be disposed on the first surface of the substrate 210 in the Y direction to cover the EDS function portion 240 and the remaining portions of the first and second emission electrodes 231 and 232.

Such an encapsulation portion 260 may serve to prevent damage to the ESD function portion 240 and the first and second emission electrodes 231 and 232 from an external environment such as external impact and moisture.

In this case, one surface of each of the first and second external terminals 221 and 222 and a surface of the encapsulation portion 260 may form one substantially flat surface. In other words, the one surface of each of the first and second external terminals 221 and 222, disposed on the first surface of the substrate 210, may be substantially coplanar with a surface of the encapsulation portion 260. Here, one or ordinary skill in the art would understand that the expression "substantially coplanar" refers to being lying on the same plane by allowing process errors, positional deviations, and/or measurement errors that may occur in a manufacturing process.

In addition, in some cases, one surfaces of the first and second external terminals 221 and 222 may be more convex than a surface of the encapsulation portion 260.

The encapsulation portion is illustrated on the drawing in the present exemplary embodiment, but in the present disclosure, the ESD member 200 may disposed on the first side surface of the multilayer capacitor 100, and thus, the encapsulation portion may not be formed, if necessary.

In addition, the encapsulation portion 260 may be formed of an insulator, and may be, for example, a thermosetting resin such as epoxy.

The multilayer capacitor may be an open circuit in a direct current (DC) power supply, but when a crack occurs in the capacitor body due to an external environment, internal electrodes may overlap each other or a current path may be generated, resulting in a defect due to a short circuit.

The defect due to the short circuit may cause an overcurrent to flow through an unwanted line to adversely affect other components.

A multilayer capacitor according to the related art was designed so that a short circuit between two internal electrodes does not occur even though a crack occurs by increasing margins of external electrodes in which a crack easily occurs due to external force. However, in this case, areas of the internal electrodes implementing a capacitance are relatively reduced due to the increase in the margins.

According to the present exemplary embodiment, an ESD protection function may be implemented without changing a design of the internal electrodes of the multilayer capacitor by attaching a high rigidity chip having emission electrodes to one side surface of the multilayer capacitor to provide an ESD bypassing function such as an ESD suppressor.

In addition, in the present exemplary embodiment, a corresponding voltage may be adjusted by adjusting an interval (the space portion 250) between the first and second emission electrodes 231 and 232 and adjusting a content of conductive particles forming the ESD function portion 240.

In addition, the electronic component according to the present exemplary embodiment may have a structure in which the ESD member 200 is attached to the side surface of the multilayer capacitor 100, and may be used for various chip components without changing a design.

According to one exemplary embodiment of the present disclosure, each of the first and second external terminals 221 and 222 disposed on a portion of the first surface of the substrate 210 may extend along a side surface of the substrate 210 and extend further onto a portion of a second surface of the substrate 210 opposing the first surface of the substrate 210 and facing away from the capacitor body 110 in the Y direction.

In this embodiment, the substrate 210 may include an increased-thickness portion at a center portion of the substrate 210. The first and second external terminals 221 and 222 extending onto the second surface of the substrate 210 may contact opposing side surfaces of the increased-thickness portion, respectively.

In this embodiment, one surface of each of the first and second external terminals 221 and 222, disposed on the second surface of the substrate 210, may be substantially coplanar with a surface of the increased-thickness portion.

Figure 7:
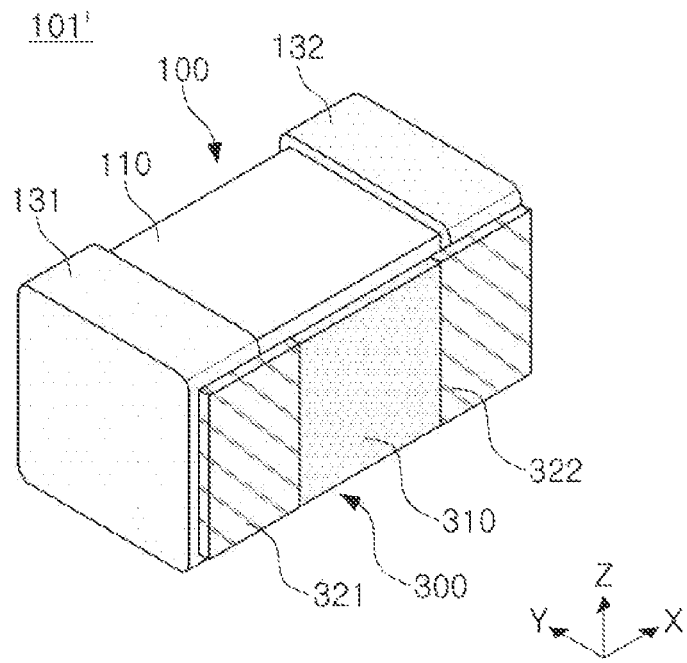
FIG. 7 is a schematic perspective view illustrating an electronic component according to a second exemplary embodiment in the present disclosure.

FIG. 7 is a schematic perspective view illustrating an electronic component according to a second exemplary embodiment in the present disclosure.

Referring to FIG. 7, in an electronic component 101' according to the present exemplary embodiment, an ESD member 300 may include a substrate 310 and first and second external terminals 321 and 322 on both ends of the substrate 310, respectively, to be connected to the first and second external electrodes 131 and 132, respectively.

In addition, such an ESD member 300 may be a varistor.

Figure 8:
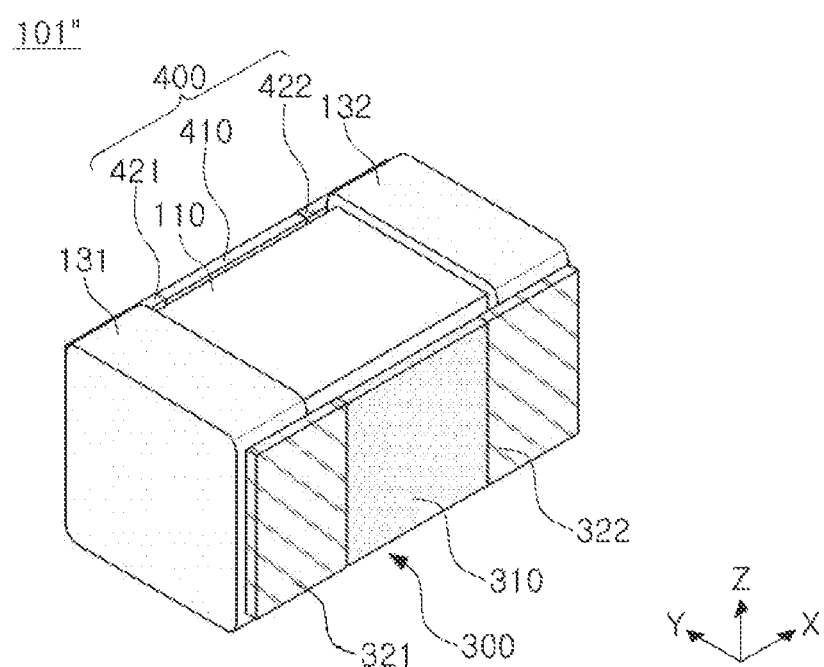
FIG. 8 is a schematic perspective view illustrating an electronic component according to a third exemplary embodiment in the present disclosure.

FIG. 8 is a schematic perspective view illustrating an electronic component according to a third exemplary embodiment in the present disclosure.

Referring to FIG. 8, in an electronic component 101" according to the present exemplary embodiment, an ESD member may include an ESD member 400 for a high voltage disposed on a first side surface of the multilayer capacitor 100 perpendicular to the mounting surface of the multilayer capacitor 100, and an ESD member 300 for a lower voltage disposed on a second side surface of the multilayer capacitor 100 perpendicular to the mounting surface of the multilayer capacitor 100 to face the ESD member 400 for a high voltage.

When the ESD member 300 fora low voltage is disposed on one side of the multilayer capacitor 100 and the ESD member 400 for a high voltage is disposed on the other side of the multilayer capacitor 100 as described above, the ESD member may be applied to an electronic component having an ESD voltage in a wider range.

Reference numeral 410 denotes a substrate of the ESD member 400 for a high voltage, and reference numerals 421 and 422 denote first and second external terminals of the ESD member 400 for a high voltage.

Figure 9:
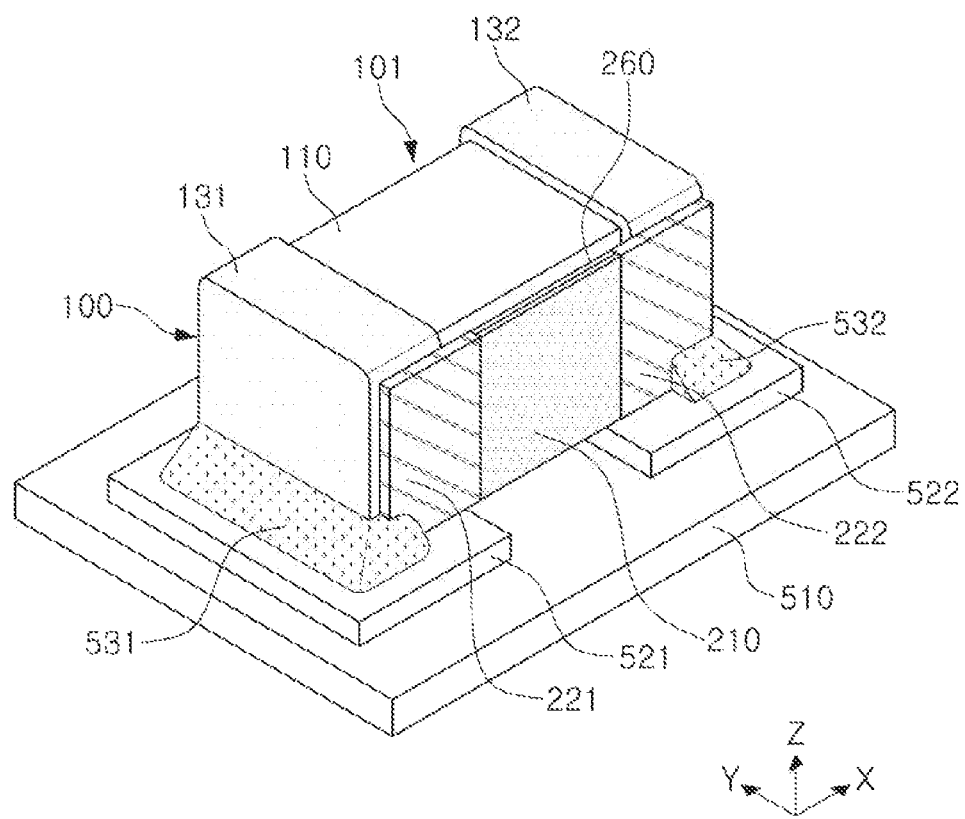
FIG. 9 is a perspective view illustrating a state in which the electronic component of FIG. 4 is mounted on a board.

FIG. 9 is a perspective view illustrating a state in which the electronic component of FIG. 4 is mounted on a board.

Referring to FIG. 9, a board according to the present exemplary embodiment may include an insulating substrate 510 and first and second electrode pads 521 and 522 disposed on an upper surface of the insulating substrate 510 to be spaced apart from each other in the X direction.

In this case, the first external electrode 131 and the first external terminal 221 may be positioned on the first electrode pad 521 to be in contact with the first electrode pad 521 in a state in which they are connected to each other, and the second external electrode 132 and the second external terminal 222 may be positioned on the second electrode pad 522 to be in contact with the second electrode pad 522 in a state in which they are connected to each other, such that the electronic component 101 may be mounted on the insulating substrate 510.

The first external electrode 131 and the first external terminal 221 may be bonded and be electrically and physically connected to the first electrode pad 521 by a solder 531, and the second external electrode 132 and the second external terminal 222 may be bonded and be electrically and physically connected to the second electrode pad 522 by a solder 532.

As set forth above, according to an exemplary embodiment in the present disclosure, the ESD of the multilayer capacitor may be effectively controlled by disposing the ESD member on one side surface of the multilayer capacitor perpendicular to the mounting surface of the multilayer capacitor.

While exemplary embodiments have been shown and described above, it will be apparent to those skilled in the art that modifications and variations could be made without departing from the scope of the present invention as defined by the appended claims.

What is claimed is:

1. An electronic component comprising:
   a multilayer capacitor including a capacitor body and first and second external electrodes respectively disposed on opposing end surfaces of the capacitor body; and
   an electrostatic discharge (ESD) member disposed on a first side surface of the multilayer capacitor perpendicular to a mounting surface of the multilayer capacitor,
   wherein the ESD member includes:
      a substrate;
      first and second external terminals disposed on two ends of the substrate in a length direction of the substrate, respectively, to be connected to the first and second external electrodes, respectively;
      first and second emission electrodes disposed on a first surface of the substrate, extending from the first and second external terminals, respectively, and disposed to be spaced apart from each other; and
      an ESD function portion disposed on the first surface of the substrate to cover portions of the first and second emission electrodes,
   wherein in a width direction of the substrate, a width of the first emission electrode is less than a width of the first external terminal and a width of the substrate, and a width of the second emission electrode is less than a width of the second external terminal and the width of the substrate,
   wherein the first and second emission electrodes are spaced apart from edges of the substrate in the length direction of the substrate,
   wherein the first and second external terminals of the ESD discharge member are arranged to be respectively connected to first and second band portions of the first and second external electrodes on the first side surface perpendicular to the mounting surface of the multilayer capacitor,
   wherein each of the first and second external terminals disposed on a portion of the first surface of the substrate extends along a side surface of the substrate and extends further onto a portion of a second surface of the substrate opposing the first surface of the substrate,
   wherein the substrate includes an increased-thickness portion at a center portion of the substrate, and
   wherein the first and second external terminals extending onto the second surface of the substrate contact opposing side surfaces of the increased-thickness portion, respectively.

2. The electronic component of claim 1, wherein the first surface of the substrate faces the capacitor body.

3. The electronic component of claim 1, wherein the ESD member further includes an encapsulation portion disposed on the first surface of the substrate to cover portions of the first and second emission electrodes other than the portions of the first and second emission electrodes covered by the ESD function portion.

4. The electronic component of claim 3, wherein one surface of each of the first and second external terminals and a surface of the encapsulation portion form one flat surface.

5. The electronic component of claim 3, wherein one surfaces of the first and second external terminals are more convex than a surface of the encapsulation portion.

6. The electronic component of claim 1, wherein the substrate includes ceramics or printed circuit board (PCB) materials.

7. The electronic component of claim 1, wherein the ESD member is provided in plural and includes an ESD member for a high voltage disposed on the first side surface of the multilayer capacitor perpendicular to the mounting surface of the multilayer capacitor, and an ESD member for a lower voltage disposed on a second side surface of the multilayer capacitor perpendicular to the mounting surface of the multilayer capacitor to face the ESD member for the high voltage.

8. The electronic component of claim 1, wherein the ESD member includes a varistor.

9. The electronic component of claim 1, wherein the capacitor body includes first and second surfaces opposing each other, third and fourth surfaces connected to the first and second surfaces and opposing each other, and fifth and sixth surfaces connected to the first and second surfaces of the capacitor body, and connected to the third and fourth surfaces, and opposing each other, and one end portions of first and second internal electrodes are in contact with the third and fourth surfaces, respectively, and
wherein the first and second external electrodes include, respectively, first and second connection portions disposed on the third and fourth surfaces of the capacitor body, respectively, and the first and second band portions extending from the first and second connection portions to portions of the first, second, fifth, and sixth surfaces of the capacitor body, respectively, and connected to the first and second external terminals, respectively.

10. The electronic component of claim 1, wherein the substrate includes ceramics or printed circuit board (PCB) materials.

11. The electronic component of claim 1, wherein the covered portions of the first and second emission electrodes are disposed between the ESD function portion and the substrate.

12. A board having an electronic component, comprising:
a multilayer capacitor including a capacitor body and first and second external electrodes respectively disposed on opposing end surfaces of the capacitor body;
an electrostatic discharge (ESD) member disposed on a first side surface of the multilayer capacitor perpendicular to a mounting surface of the multilayer capacitor; and
an insulating substrate and first and second electrode pads disposed on an upper surface of the insulating substrate to be spaced apart from each other,
wherein the first external electrode and the first external terminal are bonded to the first electrode pad by a solder in a state in which they are connected to each other,
wherein the second external electrode and the second external terminal are bonded to the second electrode pad by a solder in a state in which they are connected to each other,
wherein the ESD member includes:
a substrate;
first and second external terminals disposed on two ends of the substrate in a length direction of the substrate, respectively, to be connected to the first and second external electrodes, respectively;
first and second emission electrodes disposed on a first surface of the substrate, extending from the first and second external terminals, respectively, and disposed to be spaced apart from each other; and
an ESD function portion disposed on the first surface of the substrate to cover portions of the first and second emission electrodes,
wherein in a width direction of the substrate, a width of the first emission electrode is less than a width of the first external terminal and a width of the substrate, and a width of the second emission electrode is less than a width of the second external terminal and the width of the substrate,
wherein the first and second emission electrodes are spaced apart from edges of the substrate in the length direction of the substrate,
wherein the first and second external terminals of the ESD discharge member are arranged to be respectively connected to first and second band portions of the first and second external electrodes on the first side surface perpendicular to the mounting surface of the multilayer capacitor,
wherein each of the first and second external terminals disposed on a portion of the first surface of the substrate extends along a side surface of the substrate and extends further onto a portion of a second surface of the substrate opposing the first surface of the substrate,
wherein the substrate includes an increased-thickness portion at a center portion of the substrate, and
wherein the first and second external terminals extending onto the second surface of the substrate contact opposing side surfaces of the increased-thickness portion, respectively.

13. An electronic component comprising:
a multilayer capacitor including a capacitor body, a first external electrode having a first connection portion disposed on a first end surface of the capacitor body, and a second external electrode having a second connection portion disposed on a second end surface of the capacitor body opposing the first end surface in a first direction of the capacitor body, wherein the capacitor body comprises a plurality of dielectric layers and first and second internal electrodes alternately disposed in a second direction of the capacitor body with each of the dielectric layers interposed therebetween, the first internal electrodes are in contact with the first connection portion on the first end surface, and the second internal electrodes are in contact with the second connection portion on the second end surface; and
an electrostatic discharge (ESD) member disposed on a first side surface of the multilayer capacitor perpendicular to the first and second end surfaces of the capacitor body and parallel to the second direction,
wherein the ESD member includes:
a substrate;
first and second external terminals disposed on two ends of the substrate in a length direction of the substrate, respectively, to be connected to the first and second external electrodes, respectively;
first and second emission electrodes disposed on a first surface of the substrate facing the capacitor body, extending from the first and second external terminals, respectively, and disposed to be spaced apart from each other;
an ESD function portion disposed on the first surface of the substrate to cover portions of the first and second emission electrodes; and an encapsulation portion disposed on the first surface of the substrate to cover portions of the first and second emission electrodes, wherein in a width direction of the substrate, a width of the first emission electrode is less than that of the first external terminal, and a width of the second emission electrode is less than that of the second external terminal, wherein in the length direction of the substrate, a length of the encapsulation portion is less than a length of the substrate, wherein the first and second external terminals of the ESD discharge member are arranged to be respectively connected to first and second band portions of the first and second external electrodes on the first side surface perpendicular to the mounting surface of the multilayer capacitor, wherein each of the first and second external terminals disposed on a portion of the first surface of the substrate extends along a side surface of the substrate and extends further onto a portion of a second surface of the substrate opposing the first surface of the substrate, wherein the substrate includes an increased-thickness portion at a center portion of the substrate, and wherein the first and second external terminals extending onto the second surface of the substrate contact opposing side surfaces of the increased-thickness portion, respectively.

14. The electronic component of claim 13, further comprising another ESD member disposed on a second side surface of the multilayer capacitor opposing the first side surface.

15. The electronic component of claim 13, wherein one surface of each of the first and second external terminals, disposed on the first surface of the substrate, is coplanar with a surface of the encapsulation portion, and another surface of each of the first and second external terminals, disposed on the second surface of the substrate, is coplanar with a surface of the increased-thickness portion.

16. The electronic component of claim 13, wherein a thickness, in the second direction, of the first and second emission electrodes is smaller than a thickness, in the second direction, of the first and second external terminals disposed on the first surface of the substrate.

* * * * *